(12) United States Patent
Tang et al.

(10) Patent No.: US 9,666,930 B2
(45) Date of Patent: May 30, 2017

(54) INTERFACE BETWEEN A SEMICONDUCTOR DIE AND A WAVEGUIDE, WHERE THE INTERFACE IS COVERED BY A MOLDING COMPOUND

(71) Applicant: Freescale Semiconductor, Inc., Austin, TX (US)

(72) Inventors: Jinbang Tang, Chandler, AZ (US); Neil T. Tracht, Paradise Valley, AZ (US)

(73) Assignee: NXP USA, INC., Austin, TX (US)

( * ) Notice: Subject to any disclaimer, the term of this patent is extended or adjusted under 35 U.S.C. 154(b) by 87 days.

(21) Appl. No.: 14/521,620

(22) Filed: Oct. 23, 2014

(65) Prior Publication Data

US 2016/0118705 A1 Apr. 28, 2016

(51) Int. Cl.
*H01P 5/107* (2006.01)
*H01P 11/00* (2006.01)
*H01L 23/66* (2006.01)
*H01L 23/31* (2006.01)

(52) U.S. Cl.
CPC .............. *H01P 5/107* (2013.01); *H01L 23/66* (2013.01); *H01P 11/003* (2013.01); *H01L 23/3121* (2013.01); *H01L 2224/18* (2013.01); *H01L 2924/0002* (2013.01)

(58) Field of Classification Search
CPC ........................................................ H01P 5/107
USPC ..................................... 333/26, 247; 257/664
See application file for complete search history.

(56) References Cited

U.S. PATENT DOCUMENTS

| 5,912,598 | A | 6/1999 | Stones et al. |
| 7,081,661 | B2 * | 7/2006 | Takehara ............ H01L 23/3121 |
| | | | 257/433 |
| 7,276,987 | B2 | 10/2007 | Koriyama |
| 8,168,464 | B2 | 5/2012 | Tang |
| 8,283,764 | B2 | 10/2012 | Tang |
| 2009/0057849 | A1 | 3/2009 | Tang et al. |
| 2012/0068316 | A1 * | 3/2012 | Ligander ........... H01L 23/49503 |
| | | | 257/664 |
| 2012/0256707 | A1 * | 10/2012 | Leiba ...................... H01P 3/003 |
| | | | 333/208 |

* cited by examiner

*Primary Examiner* — Benny Lee

(57) ABSTRACT

The embodiments described herein provide for the formation of circuit waveguide interfaces during a wafer-scale die packaging (WSDP) process. Specifically, during the packaging process singulated die are arranged on a wafer-like panel and covered with molding compound that will provide the bodies of the packages. A circuit waveguide interface is formed in the molding compound and subsequent metallization layers. This circuit waveguide interface can include an array of first conductors arranged in the molding compound, and a reflector interface and excitation element formed during metallization.

19 Claims, 13 Drawing Sheets

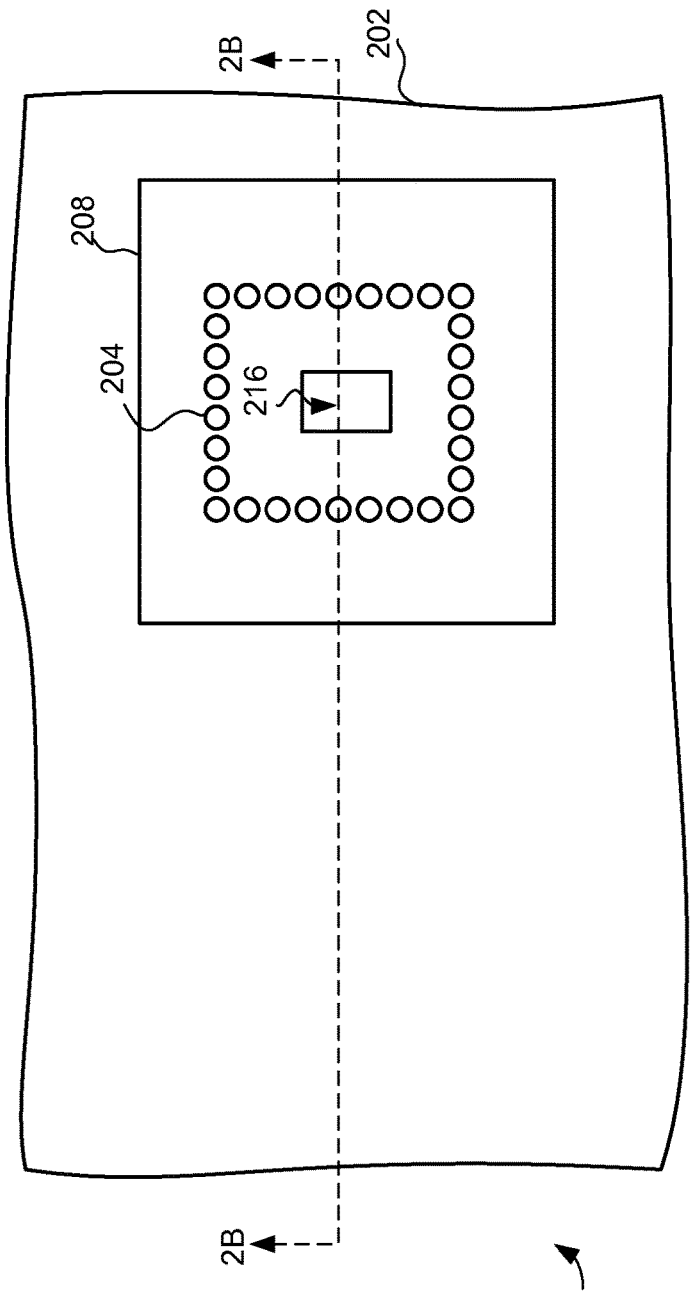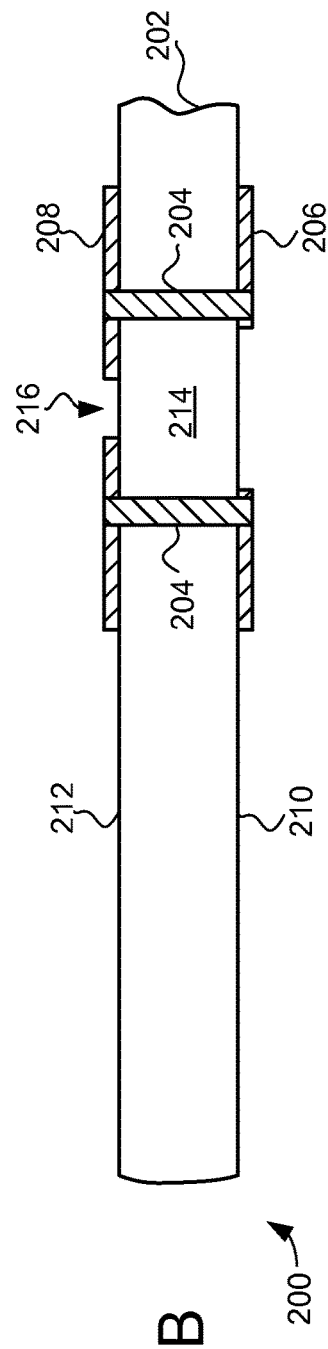
FIG. 2A
FIG. 2B

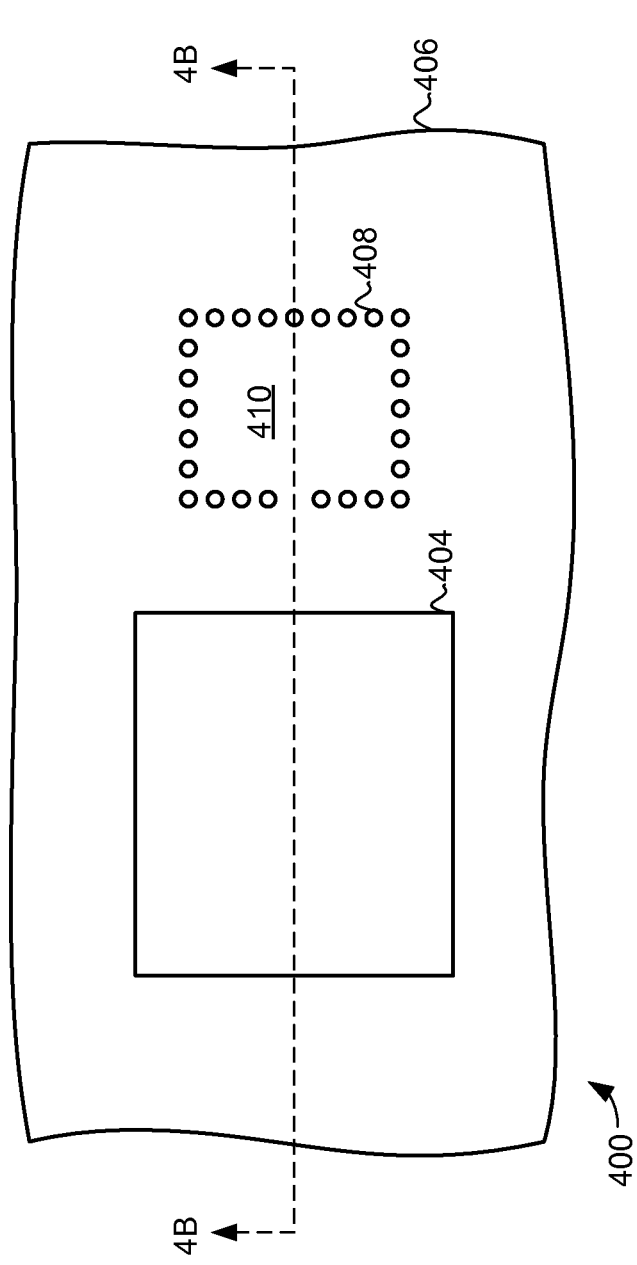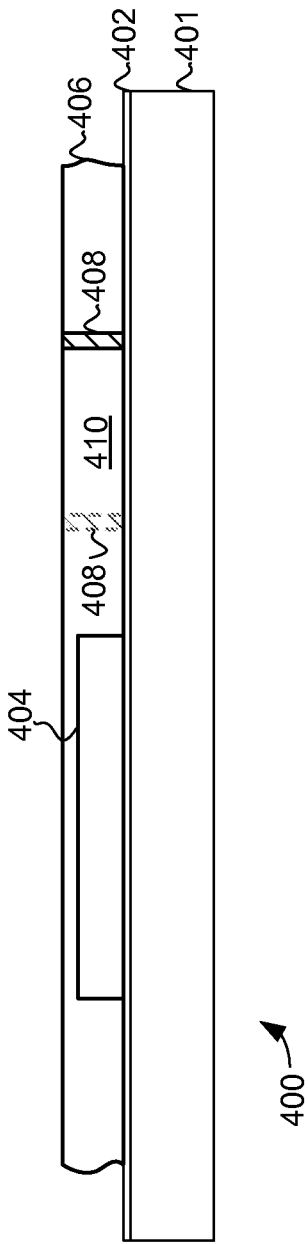
FIG. 4A
FIG. 4B

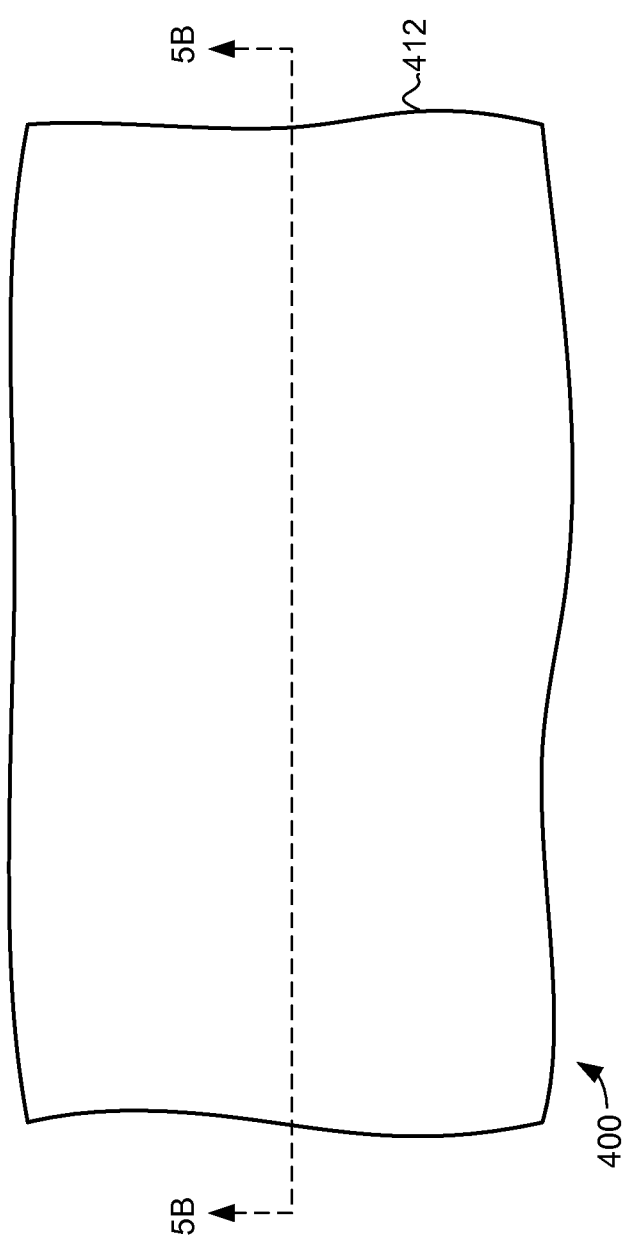
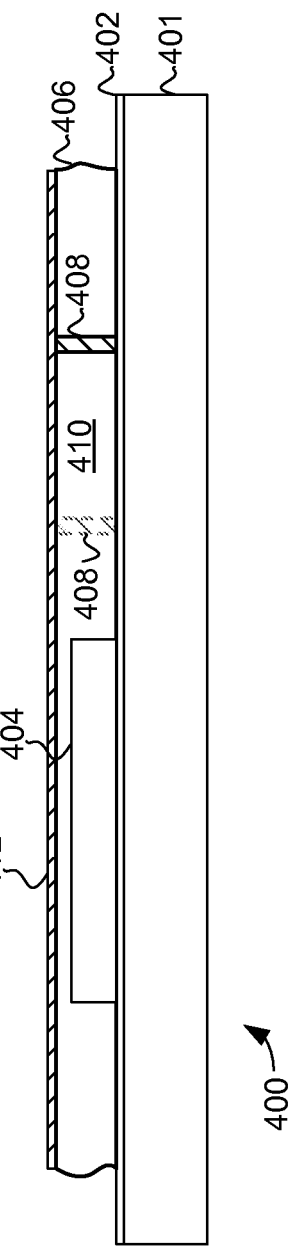
FIG. 5A
FIG. 5B

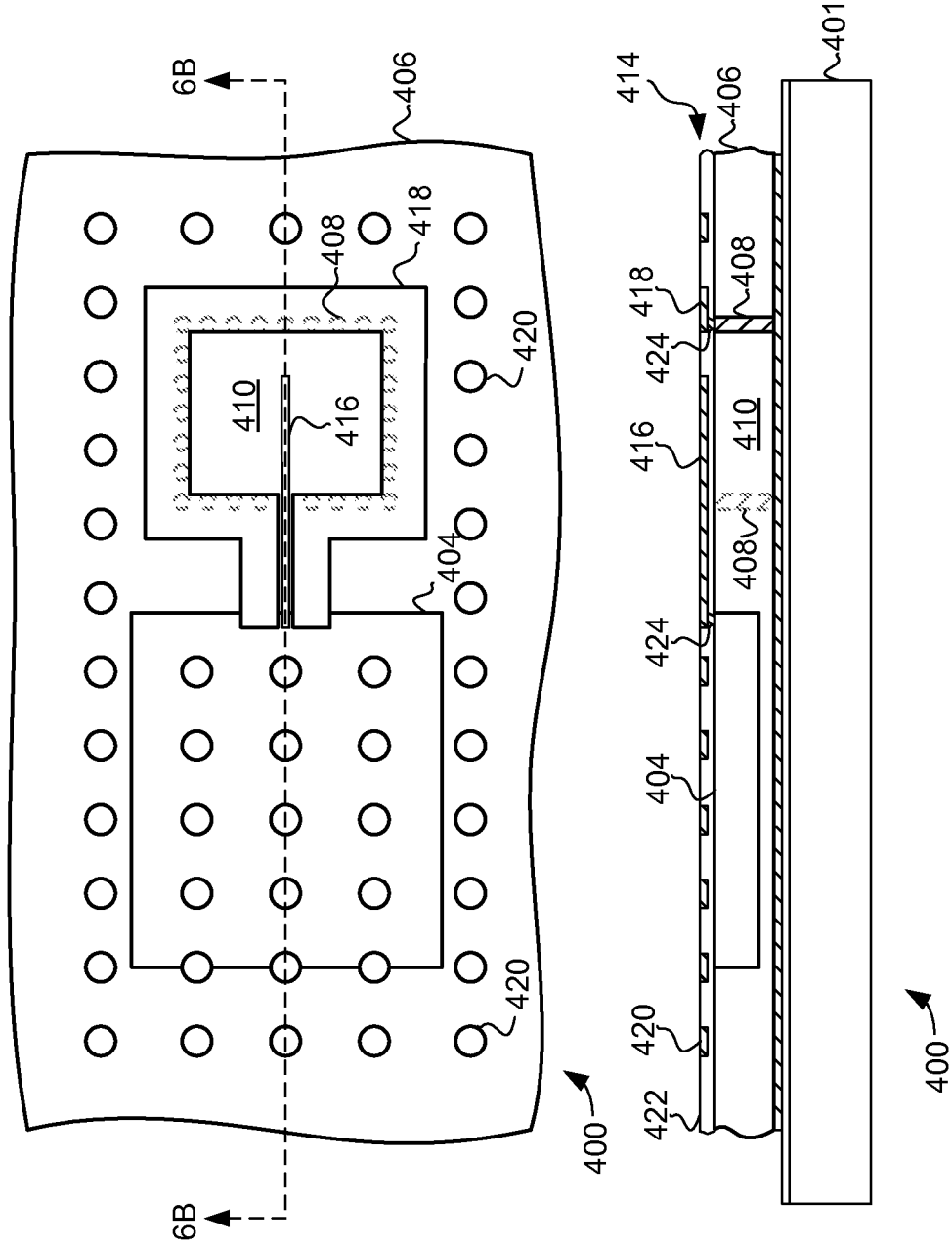

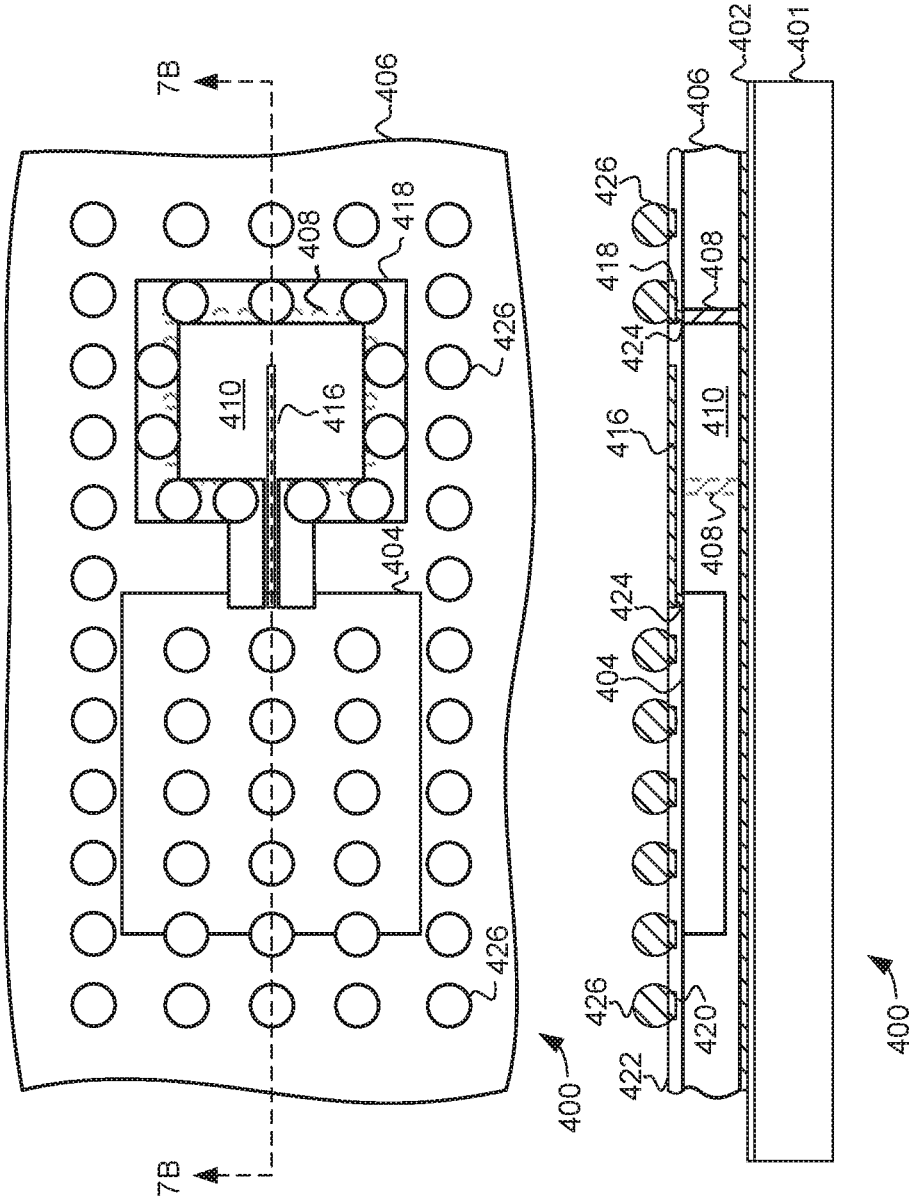

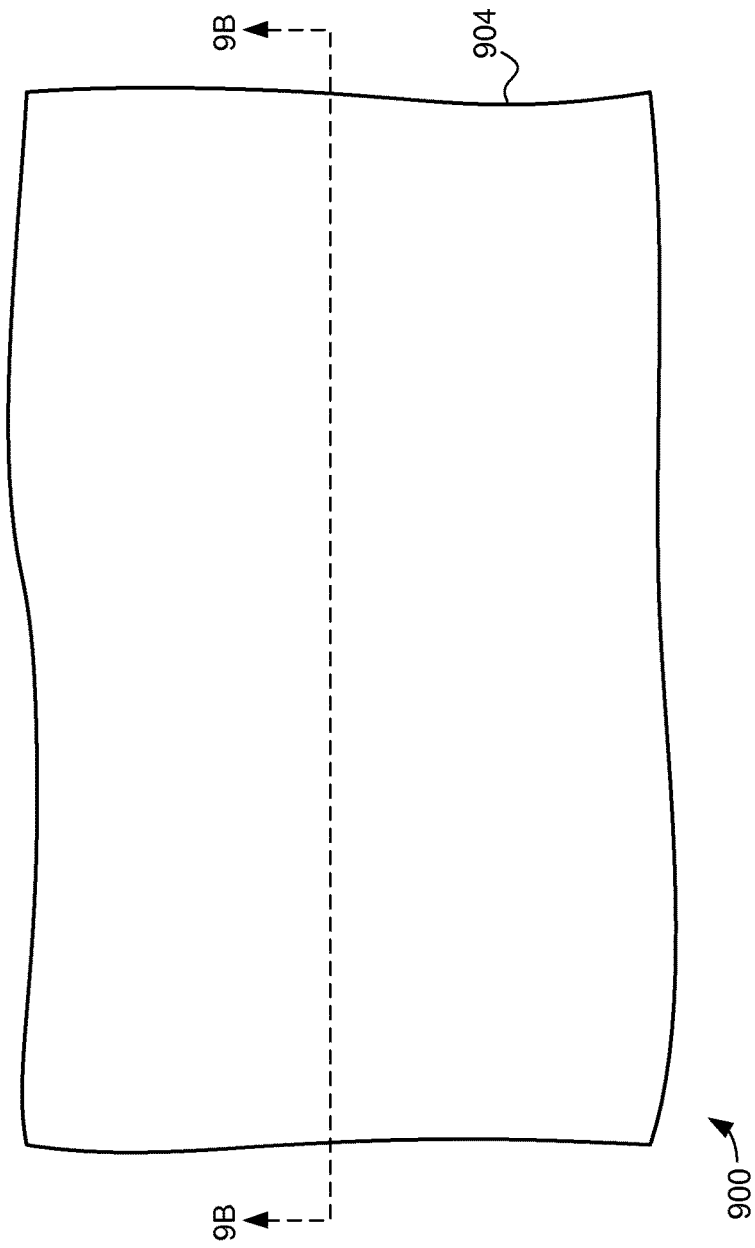
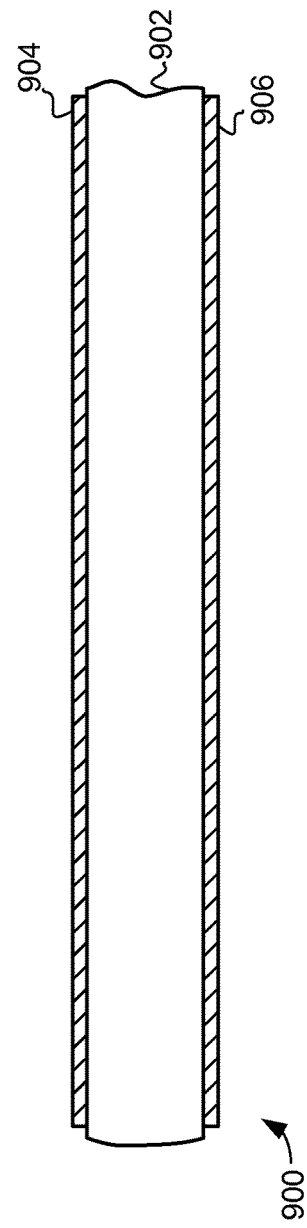
FIG. 9A
FIG. 9B

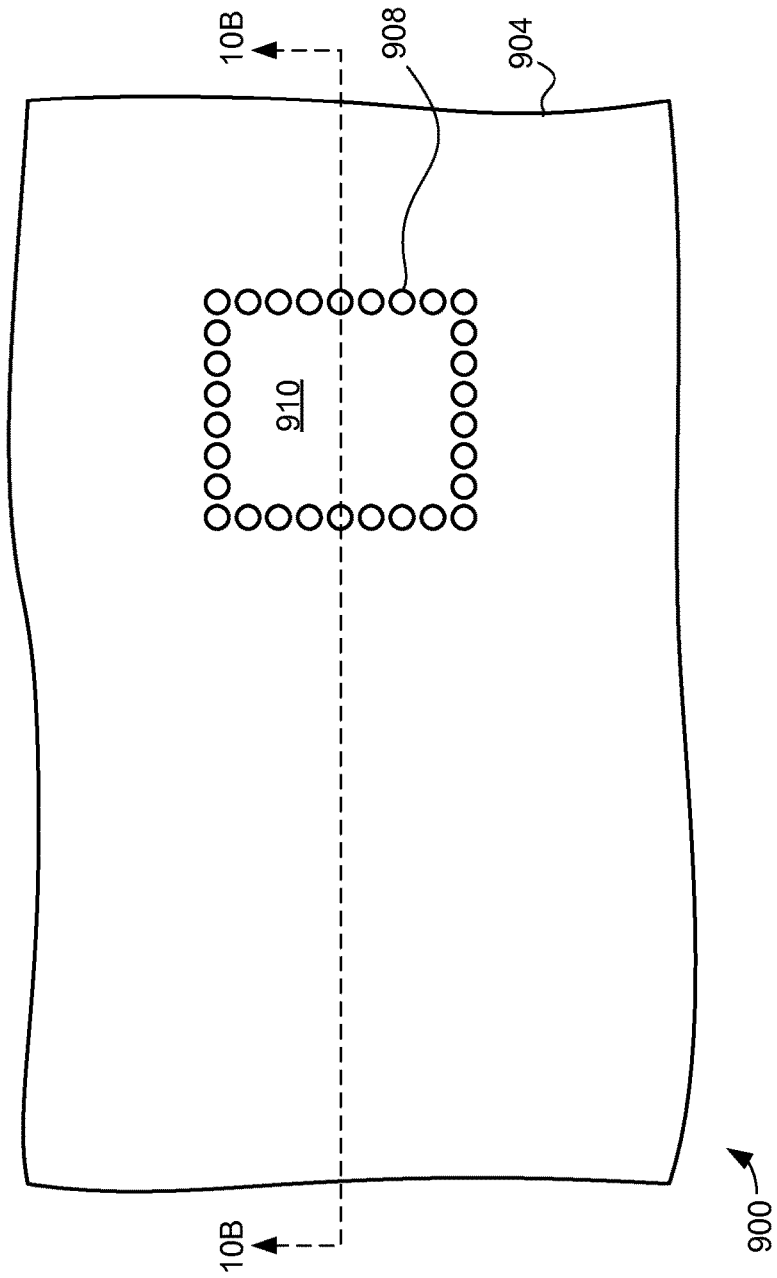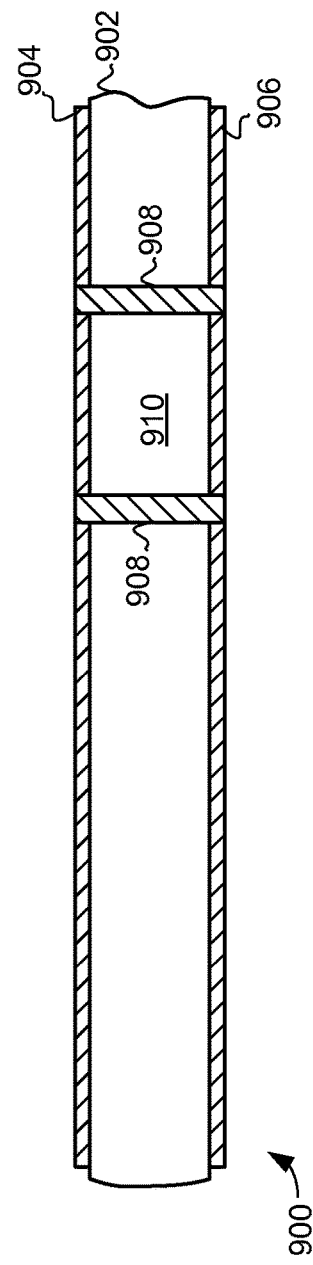
FIG. 10A
FIG. 10B

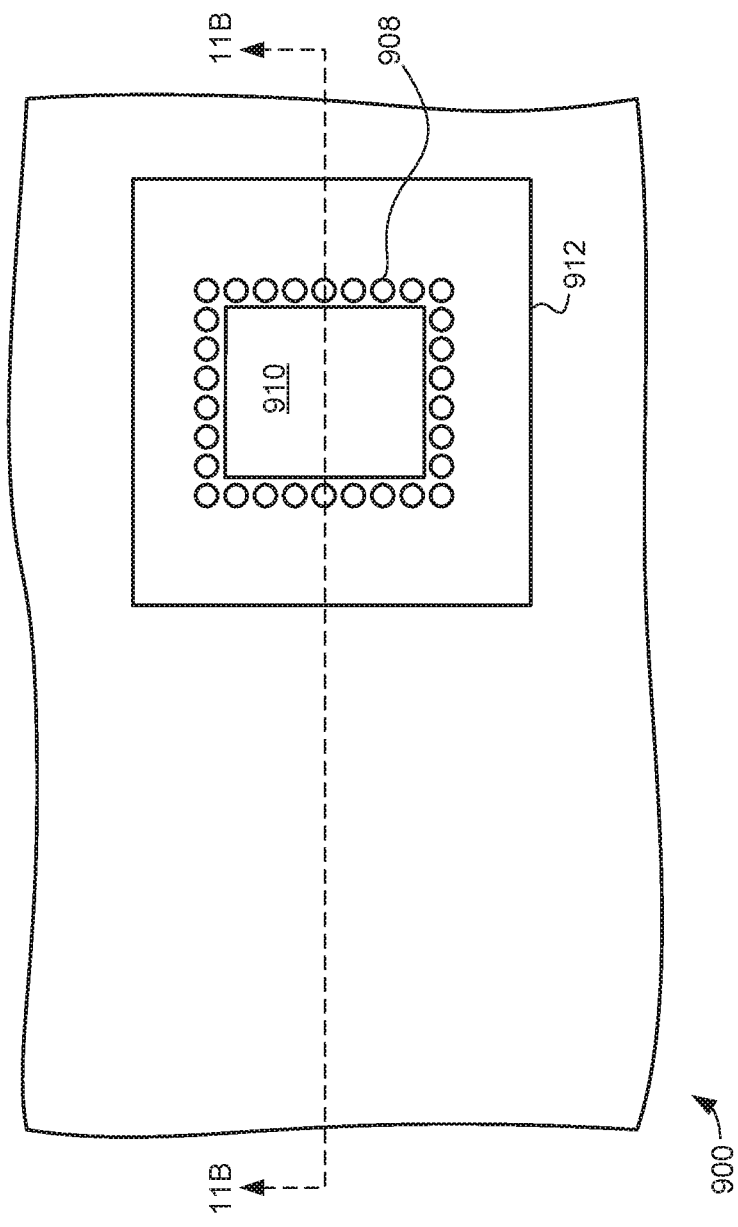
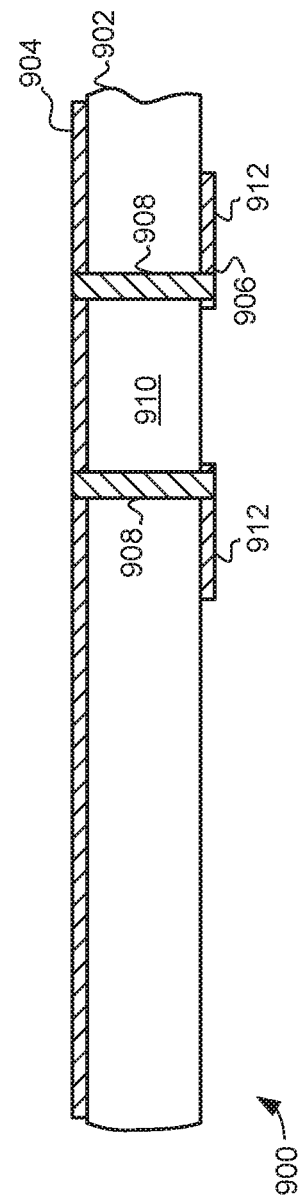
FIG. 11A
FIG. 11B

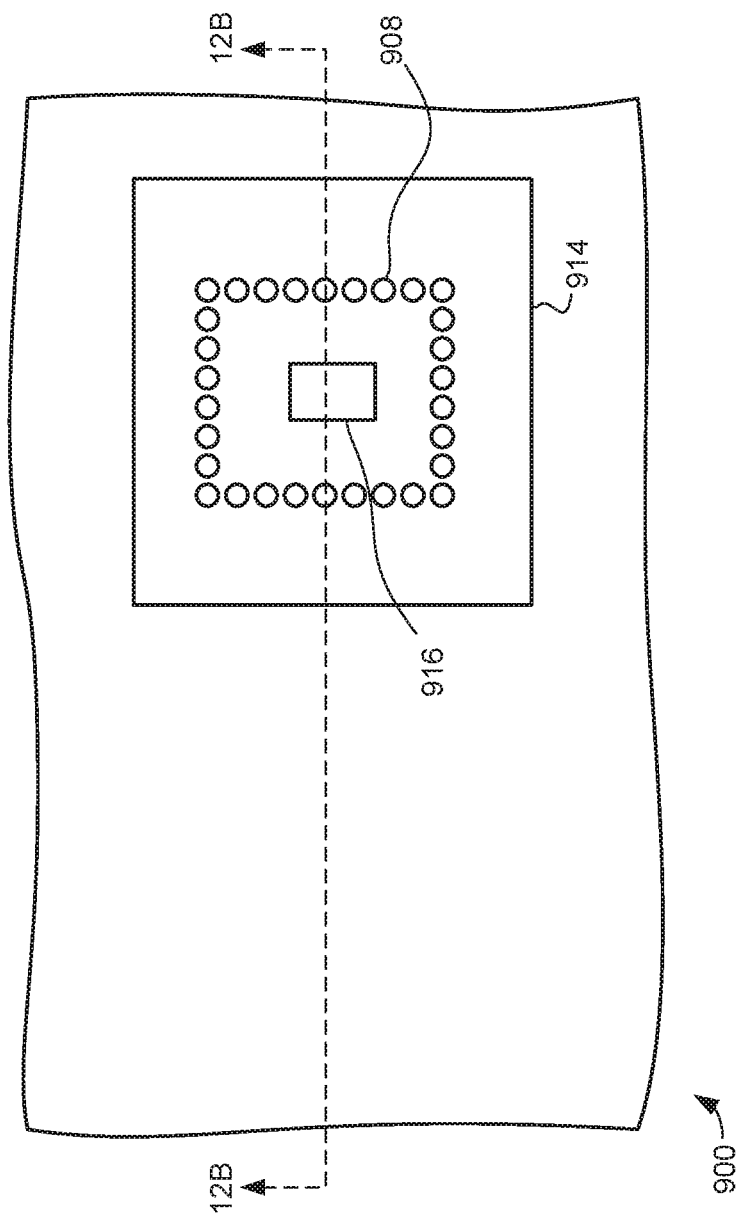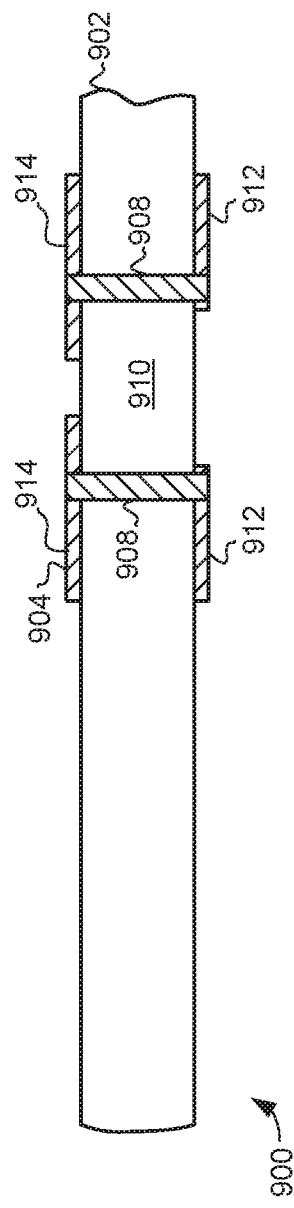
FIG. 12A
FIG. 12B

US 9,666,930 B2

INTERFACE BETWEEN A SEMICONDUCTOR DIE AND A WAVEGUIDE, WHERE THE INTERFACE IS COVERED BY A MOLDING COMPOUND

TECHNICAL FIELD

Embodiments of the subject matter described herein relate generally to electronic devices, and more particularly to circuit waveguide interfaces for packaged semiconductor devices.

BACKGROUND

Semiconductor devices typically are formed on semiconductor wafers that are then singulated into individual dies. Each die typically includes one or more integrated circuits or other comparable devices. The singulated dies are then mounted in a package that provides the external terminations in the form of leads. These leads provide the ohmic connections that are typically used to connect these packaged semiconductor devices to external assemblies such as circuit boards.

However, some applications often require the ability to make additional high frequency connections. For example, high frequency systems such as millimeter wave systems may also use waveguides to facilitate high frequency communication. In order to achieve such high frequency communication an appropriate interface between such waveguides and packaged semiconductor devices is needed.

Such interfaces can require precise manufacturing that may be not possible with some conventional semiconductor manufacturing processes. Thus, the addition of such high frequency capability can add significant cost and complication to such devices. Thus, there remains a need to provide improved techniques and structures for providing circuit waveguide interfaces to packaged semiconductor devices.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 2A and 2B are top and cross-sectional side views of a circuit board interface in accordance with an example embodiment;

FIGS. 4A, 4B, 5A, 5B, 6A, 6B, 7A, and 7B are top and cross-sectional side views of a circuit waveguide interface at various stages of fabrication in accordance with an example embodiment;

FIGS. 9A, 9B, 10A, 10B, 11A, 11B, 12A and 12B are top and cross-sectional side views of a circuit board interface at various stages of fabrication in accordance with an example embodiment.

DETAILED DESCRIPTION

The embodiments described herein can provide circuit waveguide interfaces for semiconductor devices with both relatively high performance and low cost. In general, the embodiments described herein provide circuit waveguide interfaces integrated with the semiconductor device packaging. Specifically, the embodiments provide for the formation of the circuit waveguide interface during a wafer-scale die packaging (WSDP) process. In general, WSDP processes use wafer-type processing techniques to form semiconductor packages as a functional part of the die, and thus can offer a significant reduction in the packaged-die area and thickness. The embodiments described herein use WSDP processes to both form the package and form a circuit waveguide interface integrated with the package, and thus can facilitate the formation of the circuit waveguide interface with both relatively high precision and relatively low cost and complexity.

In WSDP processes singulated die are arranged on a wafer-like panel for processing and packaging. The singulated die on the panel are then covered with molding compound that will harden to provide the bodies of the packages of the die on the panel. Photolithography and other wafer-type processing techniques are used to form one or more metallization layers (e.g., copper) that provide connections from the die to outside the package. In WSDP processing these connections can be formed on the top and bottom sides of the molded die and can include interconnects between metallization layers. For example, metallization layers on one side can be formed for die to die connections, and metallization layers on the other side can be formed to provide landing pad arrays. The molded die on the panel are then singulated into discrete packages. As will be described in greater detail below, the embodiments herein provide a technique for forming a circuit waveguide interface during such a wafer-scale die packaging process.

Figure 1A:
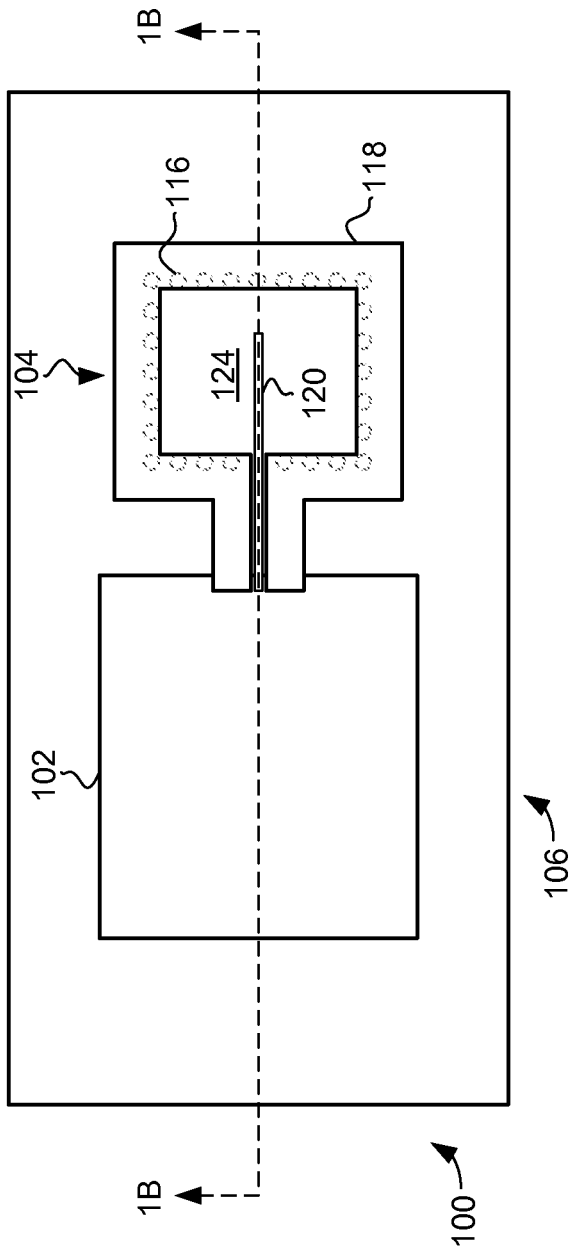
FIGS. 1A and 1B are bottom and cross-sectional side views of a packaged semiconductor device with a circuit waveguide interface in accordance with an example embodiment.
Figure 1B:
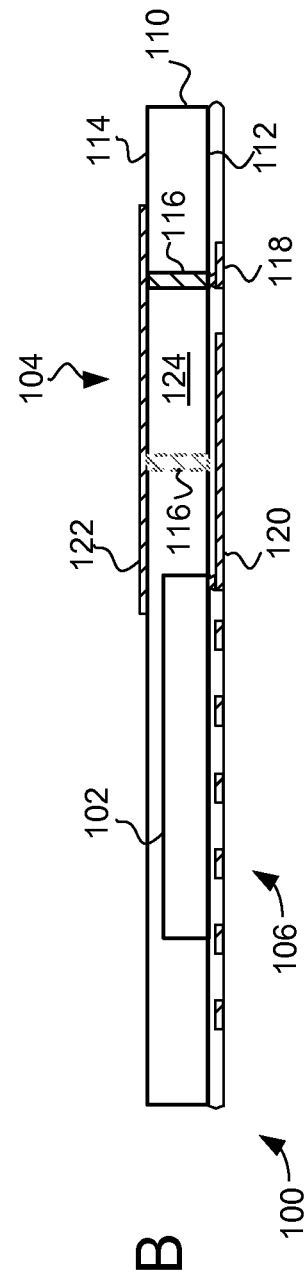

Turning now to FIGS. 1A and 1B, a bottom view and a cross sectional side view (through line 1B-1B of FIG. 1A) of a packaged semiconductor device 100 is illustrated. The packaged semiconductor device 100 includes an integrated circuit (IC) die 102, a circuit waveguide interface 104 and a package 106, with the package 106 containing the IC die 102 and the circuit waveguide interface 104. In accordance with the embodiments described herein, the circuit waveguide interface 104 is formed as part of the WSDP process used to form the package 106 around the die 102.

In the illustrated embodiment, the die 102 includes an active side (typically including die bonding pads), and an inactive side opposite the active side. To form the package 106 a molding compound 110 is applied to cover the die 102, with the formed molding compound 110 having a first side 112 and a second side 114 as shown in FIG. 1B. The molding compound first side 112 corresponds to the die 102 active side, and the molding compound second side 114 corresponds to the die 102 inactive side.

To form the circuit waveguide interface 104 with the package 106, a first array of conductors 116, a reflector interface 118, an excitation element 120, and a conductive layer 122 (FIG. 1A) are provided. The first array of conductors 116 is formed in the molding compound 110, with the conductors 116 each extending from the molding compound first side 112 to the molding compound second side

114. The conductors 116 are arranged in the molding compound 110 to define a first waveguide interface perimeter surrounding a first waveguide interface interior 124. The reflector interface 118 is formed at the molding compound first side 112, with the reflector interface 118 substantially extending around and overlapping the first waveguide interface perimeter. The excitation element 120 is formed at the molding compound first side 112, with the excitation element 120 coupled to the die 102 and extending past the first waveguide interface perimeter into the first waveguide interface interior 124. A conductor layer 122 is formed at the molding compound second side 114, and is patterned to have a dimension that corresponds to the perimeter of the reflector interface 118. Together, the first array of conductors 116, the reflector interface 118, and conductor layer 122 form a waveguide reflector for the circuit waveguide interface 104. Note that in the illustrated embodiment, a conductor 116 is not present under the excitation element 120, and thus would not appear in the cross-sectional view. However, in FIG. 1B the position of the next adjacent conductor 116 is illustrated in semi-transparent form to illustrate the position of the next adjacent conductor 116 and better illustrate interface interior 124.

As will be described in greater detail below, each of the first array of conductors 116, the reflector interface 118, the excitation element 120, and the conductive layer 122 can be formed as part of the WSDP process used to form the package 106. The use of this process to form these elements can allow the circuit waveguide interface 104 to be fabricated with the relatively high precision needed for high frequency applications and at relatively low cost.

In one embodiment, the first array of conductors 116 comprises vias in the molding compound 110 filled with conductive material. In this embodiment, the first array of conductors 116 can be fabricated by forming the vias in the molding compound 110, and then depositing conductive material to fill the vias, followed by appropriate planarizations. In another embodiment, the first array of conductors 116 can comprise conductive studs that are covered with the molding compound 110. In this embodiment the studs can be arranged with the die 102, and then both the die and the studs subsequently can be covered with the molding compound 110 to form the package 106. In another embodiment, the first array of conductors 116 can comprise a conductive ring that is covered with the molding compound 110. In this embodiment the ring can be arranged with the die 102, and then both the die and the ring subsequently can be covered with the molding compound 110 to form the package 106.

The dimension of the circuit waveguide interface 104 (e.g., the perimeter of the array of conductors 116) would generally be selected to optimize the electrical performance. For example, in a typical embodiment the first array of conductors 116 would be formed with a dimension that closely matches a corresponding waveguide cross section. Likewise, the thickness of the various elements (e.g., reflector interface 118) could be selected for optimal electrical performance.

In some embodiments the packaged semiconductor device 100 is mounted to a circuit board having a coupling interface for coupling to the circuit waveguide interface 104. The circuit board and coupling interface can provide various electrical design optimizations, including impedance matching, as well as providing a substrate for mounting a waveguide. Turning now to FIGS. 2A and 2B, top-view and cross-sectional side view (through line 2B-2B of FIG. 2A) of a circuit board interface 200 is illustrated. The circuit board interface 200 includes a circuit board 202, a second array of conductors 204, an interface structure 206 (FIG. 2B), and a coupling structure 208. In the illustrated embodiment as shown in FIG. 2B, the circuit board 202 includes a first side 210 and a second side 212, and the second array of conductors 204 each extend from the circuit board first side 210 to the circuit board second side 212. The second array of conductors 204 is arranged in the circuit board 202 to define a second waveguide interface perimeter surrounding a second waveguide interface interior 214 as shown in FIG. 2B. The interface structure 206 is formed at the circuit board first side 210, with the interface structure 206 defined to substantially extend around and overlap the second waveguide interface perimeter. The coupling structure 208 is formed at the circuit board second side 212. The coupling structure 208 defines a coupling slot 216 over the second waveguide interface interior 214, and is configured to substantially extend around and overlap the second waveguide interface perimeter.

So configured, the packaged semiconductor device 100 can be mounted to the circuit board interface 200, and a waveguide can be physically coupled to the circuit board interface 200. Thus, the embodiments illustrated in FIGS. 1A, 1B, 2A and 2B provide a circuit waveguide interface 104 that is integrated with the semiconductor device package 100, and a circuit board interface 200 to which the semiconductor package 100 may be coupled to complete the waveguide. As will be described below, such a circuit waveguide interface 104 can be formed during a WSDP process that is used to package the semiconductor devices. Thus, these embodiments can facilitate the formation of the circuit waveguide interface 104 with reduced process complexity and cost.

Figure 3:
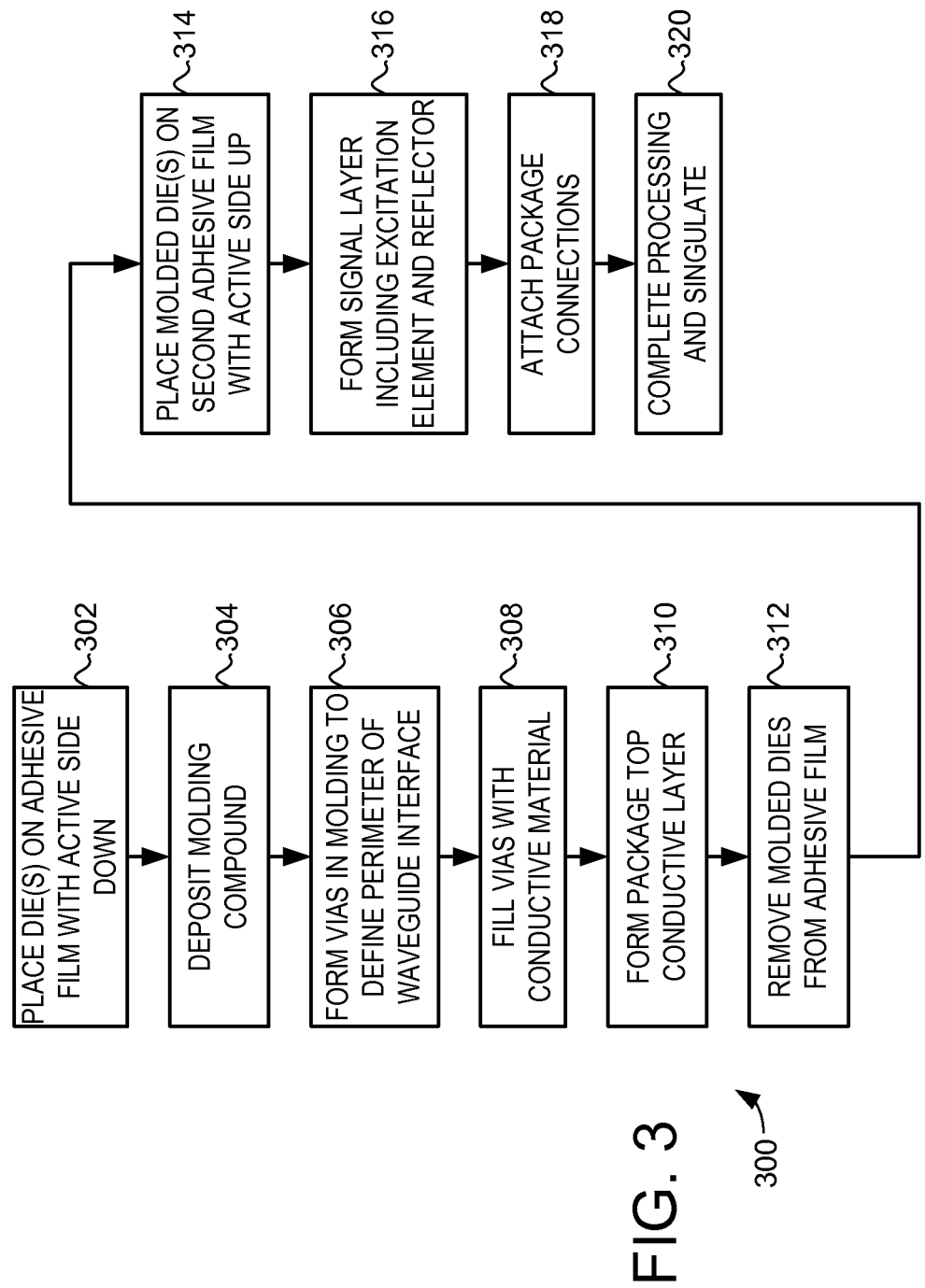
FIG. 3 is a flow diagram of a method for forming a packaged semiconductor device in accordance with an example embodiment.

Turning now to FIG. 3, a method 300 of forming a semiconductor device is illustrated. In general, the method 300 forms a circuit waveguide interface (e.g., circuit waveguide interface 104, FIGS. 1A and 1B) during a WSDP process used to package a semiconductor die. The WSDP process can form the various components of the circuit waveguide interface with relatively high precision. Thus, the method 300 can be used to form a relatively high performance circuit waveguide interface. Additionally, the method 300 can be used to form such a circuit waveguide interface with relatively low additional cost over traditional packaging. Thus, the method 300 can be used to provide such a circuit waveguide interface in a relatively cost effective manner.

Step 302 is to place integrated circuit die(s) (e.g., die 102, FIGS. 1A and 1B) on an adhesive film, with the active side of the IC dies placed down on the adhesive film. Such dies would typically be formed by fabricating devices on a wafer using any suitable techniques and then singulating the wafer to create individual IC dies. When so processed, each IC die includes an active side, with the active side having the fabricated electronic circuits and contact pads used to connect to the electronic circuits. In accordance with the embodiments described herein, the fabricated IC dies would include RF devices that are to be coupled to a waveguide through a waveguide interface.

The adhesive film could comprise a combination of thermal release tape and double-sided tape. The tape is typically attached to a panel, such as a panel made of glass, and then the singulated dies are placed on the tape active side down. The dies are arranged in a pattern on the panel to facilitate wafer-type processing to form the packages and circuit waveguide interfaces. As such, the panel may have a size and shape configured to facilitate packaging using wafer fabrication tools and techniques.

Furthermore, it should be noted that other elements may also be placed on the adhesive film at this time. For example, passive components, other integrated circuits, and other such devices that will be part of the packaged semiconductor devices can be arranged and placed on the adhesive film. In one embodiment to be discussed in greater detail below, such additional elements can comprise conductive studs that are used to form the circuit waveguide interface.

Step 304 is to deposit molding compound. In WSDP processing, the molding compound is typically applied in a liquid or semi-liquid state to cover the arrangement of IC dies and associated other components on the adhesive film. The applied molding compound may then subjected to vacuum to extract bubbles that could otherwise create voids in the molding compound. The molding compound would then be cured, and in some processes it may be desirable to planarize the molding compound after curing.

Step 306 is to form vias in the molding to define a perimeter of the circuit waveguide interface. These vias can be formed with any suitable processing, including etching and laser drilling. In step 308, the vias are filled with conductive material such as metal. In some cases this is followed by a planarization process. So constructed, the filled vias form a first array of conductors (e.g., conductors 116, FIGS. 1A and 1B) that will define a waveguide interface perimeter in the molding compound.

Turning briefly to FIGS. 4A and 4B, a top view and a cross-sectional side view (through line 4B-4B of FIG. 4A) of an exemplary semiconductor device 400 after the processing of steps 302, 304, 306 and 308 is illustrated. The semiconductor device 400 includes a die 404 that has been placed on an adhesive film 402 covering a panel 401, as shown in FIG. 4B. Molding compound 406 has been deposited, cured and planarized, and a first array of conductors 408 have been formed by etching vias and filling the vias with conductive material. The first array of conductors 408 each extend from a first side of the molding compound 406 (oriented down in FIG. 413) to a second side of the molding compound 406 (oriented up in FIG. 4B). So constructed, the first array of conductors 408 define a first waveguide interface perimeter surrounding a first waveguide interface interior 410. Note that in the illustrated embodiment, a conductor 408 is not formed under where the excitation element will later be formed and thus would not appear in the cross-sectional view. However, in FIG. 4B the position of the next adjacent conductor 408 is illustrated in semi-transparent form for clarity.

Returning to FIG. 3, step 310 is to form a package top conductive layer. In general, this step is performed by depositing an appropriate conductive (e.g., metal) layer over the molding compound. Additionally, in some embodiments the conductive layer can additionally be patterned to form specific shapes and layouts. In general, the package top conductive layer serves to provide a shielding cover (e.g., shielding cover 122, FIG. 1B). In this embodiment the package top conductive layer will contact the first array of conductors, and will further serve as portion of the waveguide reflector.

Turning briefly to FIGS. 5A and 5B, a top view and a cross-sectional side view (through line 5B-5B of FIG. 5A) of the exemplary semiconductor device 400 after the processing of step 310 is illustrated. Specifically, a package top conductive layer 412 is shown formed on the second side of the molding compound 406 (FIG. 5B). The package top conductive layer 412 contacts the first array of conductors 408 SFIG. 5B) formed in the molding compound 406 (FIG. 5B), and will serve as a portion of the waveguide reflector.

In some cases the patterned top conductive layer is patterned to correspond generally to the waveguide interface perimeter, but in other cases the top conductive layer can be left intact to cover the molding compound.

Returning to FIG. 3, step 312 is to remove the molded dies from the adhesive film. In one embodiment, this can be accomplished using a heating device to release the adhesive film and then lifting the molded dies from the film and panel. This step would generally be performed at the panel level, thus removing all the molded dies from the adhesive film and panel as one element and in one action.

The next step 314 is to place the molded of dies on a second adhesive film, this time with the active side of the IC dies facing up. Again, this would generally be performed at the panel level, with all the dies for a panel placed together on the second adhesive film in one action. As will be explained below, this step prepares the molded dies for additional processing on the active side of the IC dies.

Step 316 is to form conductive signal layer(s), with an excitation element (e.g., excitation element 120, FIG. 1) and a reflector interface (e.g., reflector interface 118, FIG. 1) formed as one of the signal layers. In step 316 the signal layer(s) are formed on the first side of the molding compound, which corresponds to the active side of the IC die. This signal layer(s) can be formed as part of a larger metallization process for the WSDP packaging. As such, the signal layer(s) can be formed as part of metallization used to provide connections between the dies, other elements in the package, and pads used to provide connections to the dies in the package.

The metallization can be accomplished with the deposition of dielectric material, the selective removal of dielectric material (e.g., photolithographic etching) to form vias and channels, followed by the deposition (e.g., vapor deposition, electroplating, sputtering) of conductive materials. The deposited conductive material coats the dielectric material to form a conductive layer, fills channels to form horizontal connectors, and fills the vias to form vertical interconnects to the underlying elements. This process can be repeated to form multiple layers of metallization and vertical interconnects for the packaged semiconductor devices. As described above, such a process can be used to form an excitation element and reflector interface. It should be noted that this is just one example, and other techniques can also be used to form these elements.

Turning briefly to FIGS. 6A and 6B, a top view and a cross-sectional side view (through line 6B-6B of FIG. 6A) of the semiconductor device 400 after the processing of steps 312, 314 and 316 is illustrated. Specifically, a signal layer 414 (FIG. 6B) is shown formed at the first side of the molding compound 406. The signal layer 414 (FIG. 6B) is formed to include an excitation element 416, a reflector interface 418, and package pads 420. As shown in FIG. 6B, signal layer 414 is formed in a dielectric layer 422, and is connected to underlying elements at various points with vertical interconnects 424.

The elements of the signal layer 414 include the excitation element 416, the reflector interface 418, and package pads 420. The package pads 420 provide the semiconductor device with redistributed contacts that can be used to connect die bonding pads on the packaged die 404 to circuit boards and other such devices. The reflector interface 418 serves to reflect the signals received from a waveguide toward the excitation element 416. To facilitate this, the reflector interface 418 is formed to substantially extend around and overlap the first waveguide interface perimeter as defined by the first array of conductors 408, and is connected to the first array of conductors 408 through vertical interconnects 424. The excitation element 416 provides an antenna to receive signals from the circuit waveguide interface and deliver those signals to the die 404. In addition, the excitation element 416 provides an antenna to transmit signals from die 404 into the circuit waveguide interface. To facilitate this, the excitation element 416 extends from the die 404 past the first waveguide interface perimeter and into the first waveguide interface interior 410, and is coupled to the semiconductor die with a vertical interconnect 424.

Returning to FIG. 3, step 318 is to attach package terminations or connections to the packaged semiconductor device. This would typically involve the addition of electrical leads to the package. For example, a ball grid array (BGA) or other leads can be attached the pads on the package. In accordance with the embodiments described herein, these package terminations are also provided around the perimeter of the circuit waveguide interface. These package terminations around the perimeter of the circuit waveguide interface effectively extend the circuit waveguide interface outside the package, and thus can be used to connect the circuit waveguide interface to a waveguide or other element.

Turning briefly to FIGS. 7A and 7B, a top view and a cross-sectional side view (through line 7B-7B of FIG. 7A) of the exemplary semiconductor device 400 after the processing of step 318 is illustrated. Specifically, a ball grid array (BGA) of balls 426 is shown attached the device 400. In this case the balls 426 are attached the package pads 420 (FIG. 7B) and to the reflector interface 418. In general, the balls 426 are coupled to the package pads 420 to provide connections to the die 404 (FIG. 7B) and other such elements inside the molding compound 406. Other balls 426 are coupled to the reflector interface 418. Specifically, these balls 426 are arranged to overlap and follow the perimeter of the circuit waveguide interface that surrounds the first waveguide interface interior 410. As such, the balls 426 effectively extend the circuit waveguide interface to outside the semiconductor device 400, and can be used to couple the circuit waveguide interface to a waveguide.

Returning to FIG. 3, step 320 is to complete processing and signulate the molded compound, dies, and circuit waveguide interfaces into individual molded packages. This would typically be accomplished using a suitable sawing or scribing technique. So constructed, each package could include one or more IC dies and one or more associated circuit waveguide interfaces.

Method 300 thus illustrates a technique that facilitates the formation of a circuit waveguide interface during a WSDP process that is used to package a semiconductor device. The use of the WSDP process can allow the reflector interface of the circuit waveguide interface (e.g., first array of conductors 408, reflector interface 418, conductor layer 122) to be formed with relatively high precision. Additionally, the use of the WSDP process can allow the formation of such circuit waveguide interface with relatively little additional cost and complexity. Thus, these embodiments can facilitate the formation of the circuit waveguide interface with reduced process complexity and cost (e.g., without requiring additional machining of the waveguide interface or an external waveguide adapter). Examples of embodiments and applications for the waveguide interface include millimeter wave (mmW) and radio frequency (RF) applications.

In the embodiments discussed above, the first array of conductors 408 were formed by depositing and curing the molding compound, etching vias in the molding compound, and then filling the vias with conductive materials. It should be understood that this is just one exemplary technique. In a second technique, the first array of conductors 408 can be formed by arranging pre-formed conductive studs on the adhesive film and then covering the conductive studs with molding compound. In this embodiment, the conductive studs would typically be placed on the adhesive film concurrently with the placement of dies on the adhesive film (e.g., during step 302). Then, the depositing of the molding compound would cover both the die 404 and the conductive studs (e.g., during step 304). Thus, this technique can simplify the formation of the first array of conductors 408 that are used to define the waveguide interface perimeter.

In a third technique, the first array of conductors 408 can be formed with a conductive ring. In this embodiment, the conductive ring would typically be placed on the adhesive film concurrently with the placement of dies on the adhesive film (e.g., during step 302). Then, the depositing of the molding compound would cover both the die 404 and the ring.

Figure 8:
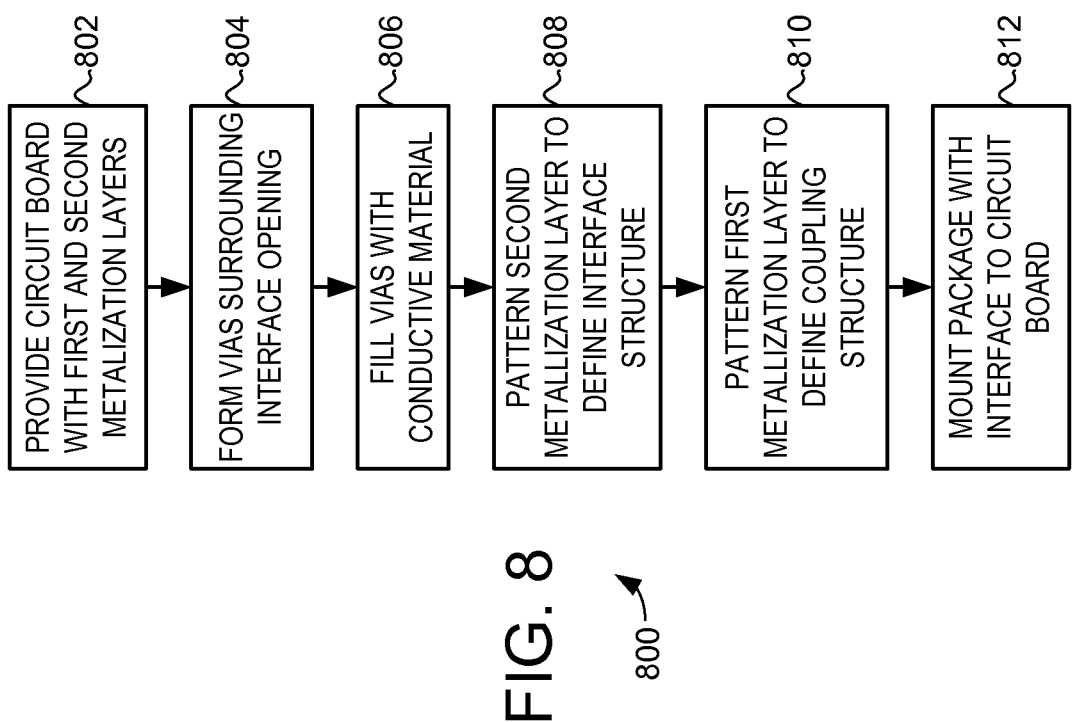
FIG. 8 is a flow diagram of a method for forming circuit board interface in accordance with an example embodiment.

As was described above, in some embodiments a packaged semiconductor device (e.g., device 100, 400) is mounted to a circuit board interface (e.g., interface 200), which in turn is coupled to a waveguide. In the example of FIGS. 2A and 2B, the circuit board interface 200 includes a circuit board 202, a second array of conductors 204, an interface structure 206, and a coupling structure 208. So configured, the packaged semiconductor device 100, 400 can be mounted to the circuit board interface 200, and a waveguide can be physically coupled to the circuit board interface 200. Thus, the circuit board interface 200 serves as an intermediary between the package with the integrated circuit waveguide interface and the waveguide itself Turning now to FIG. 8, a method 800 of forming a circuit board interface (e.g., circuit board interface 200, FIGS. 2A and 2B) is illustrated. In step 802 a circuit board is provided, with the circuit board including a first metallization layer on a first side and a second metallization layer on a second side. The circuit board provided could comprise any suitable type of circuit board, including printed circuit boards formed from FR4 substrate material. Likewise, the first and second metallization layers can comprise any suitable type of metallization, including copper.

Turning briefly to FIGS. 9A and 9B, a top view and a cross-sectional side view (through line 9B-9B of FIG. 9A) of a circuit board interface 900 after the step 802 is illustrated. At this point the circuit board interface 900 includes circuit board 902 (FIG. 9B), a first metallization layer 904 on the first side of the circuit board 902 (FIG. 9B), and second metallization layer 906 kFIG. 9B) on the second side of the circuit board 902.

Returning to FIG. 8, step 804 is to form vias in the circuit board surrounding the interface opening and step 806 to fill those vias with conductive material. The vias can be formed in the circuit board using any suitable technique, including various photolithographic techniques used to selectively etch substrate materials. Likewise, the vias can be filled with conductive material utilizing any suitable technique and material, including various deposition techniques. The forming and filling of the vias fabricates a second array of conductors in the circuit board. In accordance with the embodiments described herein, this second array of conductors defines a second waveguide interface perimeter.

Turning briefly to FIGS. 10A and 10B, a top view and a cross-sectional side view (through line 10B-10B of FIG. 10A) of the circuit board interface 900 after the steps 804 and 806 is illustrated. At this point a second array of conductors 908 have been formed in the circuit board 902 (FIG. 10B), with each of the second array of conductors extending from the first side of circuit board 902 (FIG. 10B) to the second side of the circuit board 902 (FIG. 10B). The second array of conductors 908 defines a second waveguide interface perimeter surrounding a second waveguide interface interior 910.

Returning to FIG. 8, step 808 is to pattern the second metallization layer to define an interface structure. This patterning of the second metallization layer can be performed using any suitable technique. Turning briefly to FIGS. 11A and 11B, a bottom view and a cross-sectional side view (through line 11B-11B of FIG. 11A) of the circuit board interface 900 after the step 808 is illustrated. At this point the second metallization layer 906 has been patterned to form an interface structure 912. The interface structure 912 is patterned to substantially extend around and overlap the second waveguide interface perimeter that is defined by the second array of conductors 908. The interface structure 912 provides an interface for receiving a waveguide. For example, a waveguide can be coupled to the interface structure 912 with a solder reflow process or mechanically attached.

Returning to FIG. 8, step 810 is to pattern the first metallization layer to define a coupling structure. This patterning of the first metallization layer can be performed using any suitable technique. Turning briefly to FIGS. 12A and 12B, a top view and a cross-sectional side view (through line 12B-12B of FIG. 12A) of the circuit board interface 900 after the step 810 is illustrated. At this point the first metallization layer 904 (FIG. 12B) has been patterned to form a coupling structure 914. The coupling structure 914 is patterned to substantially extend around and overlap the second waveguide interface perimeter defined by the second array of conductors 908. Additionally, the coupling structure 914 defines a coupling slot 916 (FIG. 12A) over the second waveguide interface interior 910 (FIG. 12B). In general, the coupling structure 914 provides an interface to couple the circuit board interface 900 to the packaged semiconductor device (e.g., device 100, 400), and specifically to provide an electrical coupling to the excitation element (e.g., excitation element 116 or 416 of FIGS. 1A, 1B, 7A and 7B). The coupling slot 916 (FIG. 12A) in the coupling structure 914 is configured to optimize electrical performance.

Returning to FIG. 8, step 812 is to mount the packaged semiconductor device to the circuit board interface. In one embodiment, the packaged semiconductor device is mounted to the circuit board interface using an array of conductors, such as a BGA. When making such a coupling, the BGA can be arranged to follow the perimeter of the waveguide interface interior. Such use of a BGA can effectively extend the circuit waveguide interface outside the package and to the circuit board interface, and thus can be used to connect the circuit waveguide interface to the circuit board interface.

Figure 13:
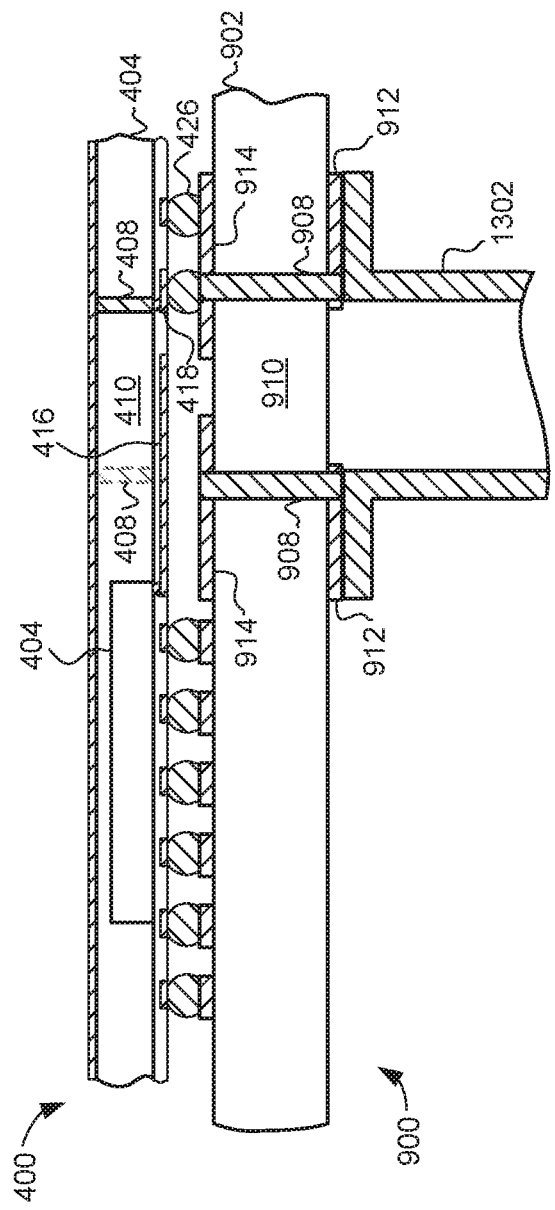
FIG. 13 is a cross-sectional side view of a packaged semiconductor device and circuit board interface in accordance with an example embodiment.

Turning FIG. 13, a cross-sectional side view of the circuit board interface 900 and the semiconductor device 400 after the step 812 is illustrated. Additionally, FIG. 13 shows a portion of an exemplary waveguide 1302 coupled to the circuit board interface 900. In this example the balls 426 are used to couple the device 400 to the circuit board interface 900. It should be noted that the some of the balls 426 are coupled between the reflector interface 418 and the coupling structure 914. Specifically, these balls 426 are arranged (as illustrated in FIG. 7A) to overlap and follow the perimeters of the waveguide interface interior 410 and the waveguide interface interior 910. As such, the balls 426 effectively extend the circuit waveguide interface between semiconductor device 400 and the circuit board interface 900.

The embodiments described herein thus provide for the formation of circuit waveguide interfaces during a wafer-scale die packaging (WSDP) process. Specifically, during the packaging process singulated die are arranged on a wafer-like panel and covered with molding compound that will provide the bodies of the packages. A circuit waveguide interface is formed in the molding compound and subsequent metallization layers. This circuit waveguide interface can include an array of first conductors arranged in the molding compound, and a reflector interface and excitation element formed during metallization.

In one embodiment, a semiconductor device is provided, comprising: a semiconductor die including an integrated circuit, the semiconductor die having an active side with die bonding pads and an inactive side opposite the active side; a molding compound that covers the semiconductor die, the molding compound having a first side and a second side, the molding compound first side corresponding to the semiconductor die active side, and the molding compound second side corresponding to the semiconductor die inactive side; and a first array of conductors, the first array of conductors extending from the molding compound first side to the molding compound second side, the first array of conductors arranged in the molding compound to define a first waveguide interface perimeter surrounding a first waveguide interface interior.

In another embodiment, a semiconductor device is provided, comprising: a semiconductor die including an integrated circuit, the semiconductor die having an active side with die bonding pads and an inactive side opposite the active side; a molding compound that covers the semiconductor die, the molding compound having a first side and a second side, the molding compound first side corresponding to the semiconductor die active side, and the molding compound second side corresponding to the semiconductor die inactive side; a first array of conductors, the first array of conductors extending from the molding compound first side to the molding compound second side, the first array of conductors arranged in the molding compound to define a first waveguide interface perimeter surrounding a first waveguide interface interior; a reflector interface formed at the molding compound first side, the reflector interface substantially extending around and overlapping the first waveguide interface perimeter; an excitation element formed at the molding compound first side, the excitation element coupled to the semiconductor die and extending past the first waveguide interface perimeter to the first waveguide interface interior; a conductive layer formed over the molding compound second side; a circuit board having a first side and a second side; a second array of conductors, the second array of conductors extending from the circuit board first side to the circuit board second side, the second array of conductors arranged in the circuit board to define a second waveguide interface perimeter surrounding a second waveguide interface interior; an interface structure formed at the circuit board first side, the interface structure substantially extending around and overlapping the second waveguide interface perimeter; a coupling structure formed at the circuit board second side, the coupling structure substantially extending around and overlapping the second waveguide interface perimeter, the coupling structure defining a coupling slot over the second waveguide interface interior; and an array of ball grids, the array of ball grids arranged to couple the coupling structure to the reflector interface.

In another embodiment, a method for forming a semiconductor device is provided, the method comprising: providing a semiconductor die including an integrated circuit, the semiconductor die having an active side with die bonding pads and an inactive side opposite the active side; covering the semiconductor die in molding compound, the molding compound having a first side and a second side, the molding compound first side corresponding to the semiconductor die active side, and the molding compound second side corresponding to the semiconductor die inactive side; and forming a first array of conductors in the molding compound, the first array of conductors extending from the molding compound first side to the molding compound second side, the first array of conductors arranged in the molding compound to define a first waveguide interface perimeter surrounding a first waveguide interface interior.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
   a semiconductor die including an integrated circuit, the semiconductor die having a first side and a second side;
   a molding compound that covers the semiconductor die, the molding compound having a first side and a second side, the molding compound first side corresponding to the semiconductor die first side, and the molding compound second side corresponding to the semiconductor die second side;
   a first array of conductors, the first array of conductors extending from the molding compound first side to the molding compound second side, the first array of conductors arranged in the molding compound to define a first waveguide interface perimeter surrounding a first waveguide interface interior;
   an excitation element formed at the molding compound first side, the excitation element coupled to the semiconductor die and extending past the first waveguide interface perimeter into the first waveguide interface interior; and
   a plurality of package pads formed at the molding compound first side.

2. The semiconductor device of claim 1 further comprising:
   a reflector interface formed at the molding compound first side, the reflector interface substantially extending around and overlapping the first waveguide interface perimeter.

3. The semiconductor device of claim 1 further comprising a conductive layer formed at the molding compound second side.

4. The semiconductor device of claim 1 further comprising:
   a circuit board having a first side and a second side; and
   a second array of conductors, the second array of conductors extending from the circuit board first side to the circuit board second side, the second array of conductors arranged in the circuit board to define a second waveguide interface perimeter surrounding a second waveguide interface interior.

5. The semiconductor device of claim 4 further comprising:
   an interface structure formed at the circuit board first side, the interface structure substantially extending around and overlapping the second waveguide interface perimeter; and
   a coupling structure formed at the circuit board second side, the coupling structure substantially extending around and overlapping the second waveguide interface perimeter, the coupling structure defining a coupling slot over the second waveguide interface interior.

6. The semiconductor device of claim 5 wherein the coupling structure is physically coupled to a reflector interface with an array of conductive balls.

7. The semiconductor device of claim 5 wherein the interface structure is configured to physically couple to a waveguide.

8. The semiconductor device of claim 1 wherein the first array of conductors comprises vias in the molding compound filled with conductive material.

9. The semiconductor device of claim 1 wherein the first array of conductors comprises conductive studs that are covered with the molding compound.

10. A semiconductor device comprising:
 a semiconductor die including an integrated circuit, the semiconductor die having an active side with die bonding pads and an inactive side opposite the active side;
 a molding compound that covers the semiconductor die, the molding compound having a first side and a second side, the molding compound first side corresponding to the semiconductor die active side, and the molding compound second side corresponding to the semiconductor die inactive side;
 a first array of conductors, the first array of conductors extending from the molding compound first side to the molding compound second side, the first array of conductors arranged in the molding compound to define a first waveguide interface perimeter surrounding a first waveguide interface interior;
 a reflector interface formed at the molding compound first side, the reflector interface substantially extending around and overlapping the first waveguide interface perimeter;
 an excitation element formed at the molding compound first side, the excitation element coupled to the semiconductor die and extending past the first waveguide interface perimeter to the first waveguide interface interior;
 a plurality of package pads formed at the molding compound first side;
 a ball array coupled to the plurality of package pads;
 a conductive layer formed over the molding compound second side;
 a circuit board having a first side and a second side;
 a second array of conductors, the second array of conductors extending from the circuit board first side to the circuit board second side, the second array of conductors arranged in the circuit board to define a second waveguide interface perimeter surrounding a second waveguide interface interior;
 an interface structure formed at the circuit board first side, the interface structure substantially extending around and overlapping the second waveguide interface perimeter;
 a coupling structure formed at the circuit board second side, the coupling structure substantially extending around and overlapping the second waveguide interface perimeter, the coupling structure defining a coupling slot over the second waveguide interface interior; and
 conductive material to couple the coupling structure to the reflector interface.

11. A method for forming a semiconductor device, the method comprising:
 providing a semiconductor die including an integrated circuit, the semiconductor die having a first side and a second side;
 covering the semiconductor die in molding compound, the molding compound having a first side and a second side, the molding compound first side corresponding to the semiconductor die first side, and the molding compound second side corresponding to the semiconductor die second side;
 forming a first array of conductors in the molding compound, the first array of conductors extending from the molding compound first side to the molding compound second side, the first array of conductors arranged in the molding compound to define a first waveguide interface perimeter surrounding a first waveguide interface interior;
 forming an excitation element at the molding compound first side, the excitation element coupled to the semiconductor die and extending past the first waveguide interface perimeter to the first waveguide interface interior.

12. The method of claim 11 wherein the step of forming the first array of conductors in the molding compound comprises:
 arranging a plurality of conductive studs; and
 covering the conductive studs with the molding compound during the step of covering the semiconductor die in the molding compound.

13. The method of claim 11 further comprising:
 forming a reflector interface at the molding compound first side, the reflector interface substantially extending around and overlapping the first waveguide interface perimeter.

14. The method of claim 11 further comprising forming a conductive layer at the molding compound second side.

15. The method of claim 11 further comprising:
 providing a circuit board having a first side and a second side; and
 forming a second array of conductors, the second array of conductors extending from the circuit board first side to the circuit board second side, the second array of conductors arranged in the circuit board to define a second waveguide interface perimeter surrounding a second waveguide interface interior.

16. The method of claim 15 further comprising:
 forming an interface structure at the circuit board first side, the interface structure substantially extending around and overlapping the second waveguide interface perimeter; and
 forming a coupling structure at the circuit board second side, the coupling structure substantially extending around and overlapping the second waveguide interface perimeter, the coupling structure defining a coupling slot over the second waveguide interface interior.

17. The method of claim 16 further comprising physically coupling the coupling structure to a reflector interface with an array of conductive balls.

18. The method of claim 16 further comprising physically coupling the interface structure to a waveguide.

19. The method of claim 11 wherein the step of forming the first array of conductors in the molding compound comprises:
 forming vias in the molding compound; and
 filling the vias with conductive material.

* * * * *